United States Patent [19]

Pfaff

[11] Patent Number: 4,491,377

[45] Date of Patent: Jan. 1, 1985

[54] MOUNTING HOUSING FOR LEADLESS CHIP CARRIER

[76] Inventor: Wayne K. Pfaff, 1316 Savannah, Irving, Tex. 75062

[21] Appl. No.: 369,347

[22] Filed: Apr. 19, 1982

[51] Int. Cl.³ ............................................. H01R 13/62
[52] U.S. Cl. .............................. 339/74 R; 339/17 CF; 339/75 M
[58] Field of Search ............. 339/17 CF, 74 R, 75 M, 339/75 MP, 258 P

[56] References Cited

U.S. PATENT DOCUMENTS

| | | | |
|---|---|---|---|
| 3,199,066 | 8/1965 | Eledge et al. | 339/258 P X |
| 3,744,005 | 7/1973 | Sitzler | 339/75 MP |
| 3,753,211 | 8/1973 | Pauza et al. | 339/75 MP |
| 4,159,861 | 7/1979 | Anhalt | 339/75 MP |
| 4,390,220 | 6/1983 | Benasutti | 339/17 CF |

Primary Examiner—Z. R. Bilinsky
Attorney, Agent, or Firm—Kanz, Scherback & Timmons

[57] ABSTRACT

Disclosed is a mounting housing for leadless chip carriers for use on burn-in boards, circuit boards and the like. The housing includes an insulating base support containing a plurality of electrically conductive axially elongated bodies extending therethrough arranged to define a rectangular cavity in a plane parallel with the first major face of the base support. The ends of the axially elongated bodies defining the cavity have edges inclined inwardly toward the cavity and edges inclined outwardly from the cavity. A spreader mounted for reciprocal movement axially with respect the elongated bodies has an inclined surface mating with the outwardly inclined edges of the elongated bodies so that movement of the spreader moves the inwardly inclined edges outwardly to permit insertion of a leadless chip carrier within the cavity.

22 Claims, 5 Drawing Figures

MOUNTING HOUSING FOR LEADLESS CHIP CARRIER

As large scale integration (LSI) techniques are applied to integrated circuit and hybrid circuit development, the density of circuit functions which may be performed by a single circuit chip becomes limited, not by the electronic functions which can be performed by the circuit chip, but by the packaging used to house the chip and the leads required for interconnecting the chip with other circuitry. Integrated circuits are conventionally housed in flat packs or dual in-line package (DIP) structures wherein interconnection leads are arranged in parallel rows extending from opposite sides of the chip housing. However, as the chip functions are expanded to require greater numbers of interconnection leads, standard DIP configurations pose serious limitations. For example, a sixty-eight pin array in conventional DIP packaging would require a DIP over three inches long. Because of impedence of the long leads required, such arrangements are unsuitable for high speed devices. Furthermore, such packages would consume an inordinate amount of circuit board area and pose problems in maintenance or replacement.

In response to the need for high density packaging for LSI devices, the industry has developed standard LSI chip carrier housings known in the art as leadless chip carriers. Conventionally, the leadless chip carrier comprises a substantially flat rectangular ceramic base piece with a centrally located cavity in one face thereof. The chip is mounted on the floor of the cavity and the cavity enclosed and hermetically sealed with a ceramic cover. Terminal lands are arranged on one or both sides of the base piece adjacent each of the four edges of the base piece and electrical communication between the terminal lands and the enclosure housing the chip is provided by gold-plated leads or the like extending from the terminal lands to the cavity. The terminal lands may be on the front side (the major face of the base piece which carries the enclosure cover) or the back side (the side of the base piece opposite the enclosure cover) or both, depending on the design of the leadless chip carrier. Furthermore, the location and arrangement of the terminal lands may vary depending on the size of the carrier and the number of terminal lands.

Conventionally, leadless chip carriers as described above are mounted in mounting means for electrical interconnection with a circuit board or the like. Since the terminal lands must contact means for forming electrical communication between the circuit elements on the printed circuit board and the terminal lands, means must be provided in the mounting housing to accurately position and align the terminal lands with respect to such contact means.

While various leadless chip carrier sizes and configurations as generally described above have been adopted as industry standards for various pin connection arrangements, the means used for interconnecting such leadless chip carriers with circuit boards or the like and thus provide electrical communication between the terminal lands of the leadless chip carrier and the circuit board varies with the particular circuit application, the functions to be performed by the particular chip and other considerations. Thus no standard means has been adopted for mounting leadless chip carriers on circuit boards or the like.

Obviously, various designs of leadless chip carrier interconnection means have been devised, each with its own unique characteristics and designed to satisfy certain requirements. Ordinarily, however, all prior mounting housings rely on registration of the mounting housing and leadless chip carrier by reference to an edge of the ceramic base piece to align the contact means of the mounting housing with the terminal lands on the leadless chip carrier. Since the position of the contact means with respect to the mounting housing is fixed, the position of the lands with respect to the edge of the base piece must be precisely fixed to insure that the contact means are in proper registry with the lands. Furthermore, the contact means are usually arranged to extend in a direction transverse to the plane of the lands, thus project upwardly and/or downwardly from the mounting housing and/or the mounting housing cover, thus contacting the lands on the broad surfaces thereof.

Unfortunately, the ceramic base piece of many leadless chip carriers is not machined to provide precision edges. Instead, the base piece is formed from a larger sheet of ceramic material by forming a plurality of precisely aligned holes in the sheet and/or scribing the sheet on one or both faces and breaking the sheet along the scribe line or aligned series of holes. Obviously, the break line which forms the edges of the base piece may or may not be precisely aligned with the holes or scribe line. However, the terminal lands are formed on the base piece at precise locations with reference to the holes or scribe line, not the actual edge of the body. Thus, where the actual edge of the body does not precisely coincide with the scribe line or line defined by the centers of the holes, and where the contact means carried by the mounting housing is aligned to contact the terminal lands by reference to the actual edge of the base piece, misalignment between the contact means and the terminal lands often occurs. This results in failure to form proper electrical contact between the contact means and the terminal lands.

In accordance with the present invention, a mounting housing is provided in which the contact means are aligned with the terminal lands by reference to the holes used to define the desired edge of the ceramic base piece. Since the contact means references the only precision formed reference point on the base piece, the contact means is always precisely located on the terminal land. Furthermore, where the land is formed with reference to the holes, the land material usually extends into the hole. The contact means of the housing of the invention extend substantially vertically (with respect to the horizontal plane of the base piece), thus the contact means may actually engage the land in the semicylindrical portion of the hole formed to define the edge of the base piece. Thus precise registration between the land and the contact means is achieved using the only precision reference point on the base piece.

The invention further provides means for rapid mounting and de-mounting of leadless chip carriers by aligning the contact means substantially vertically (with respect to the horizontal plane of the base piece) and surrounding all edges of the base piece. The contact means are resilient metal pins with outwardly sloping camming surfaces which mate with a spreader to uniformly and simultaneously spread the contact pins and to permit insertion and removal of the leadless chip carrier from the housing. Thus the housing of the invention provides a compact and simplified means for rapidly mounting and de-mounting leadless chip carriers for burn-in, testing and for circuit applications use. Furthermore, the contact pins are automatically correctly precision positioned to mate with the terminal lands.

Other features and advantages of the invention will become more readily understood from the following detailed description taken in connection with the appended claims and attached drawings in which:

Figure 1:
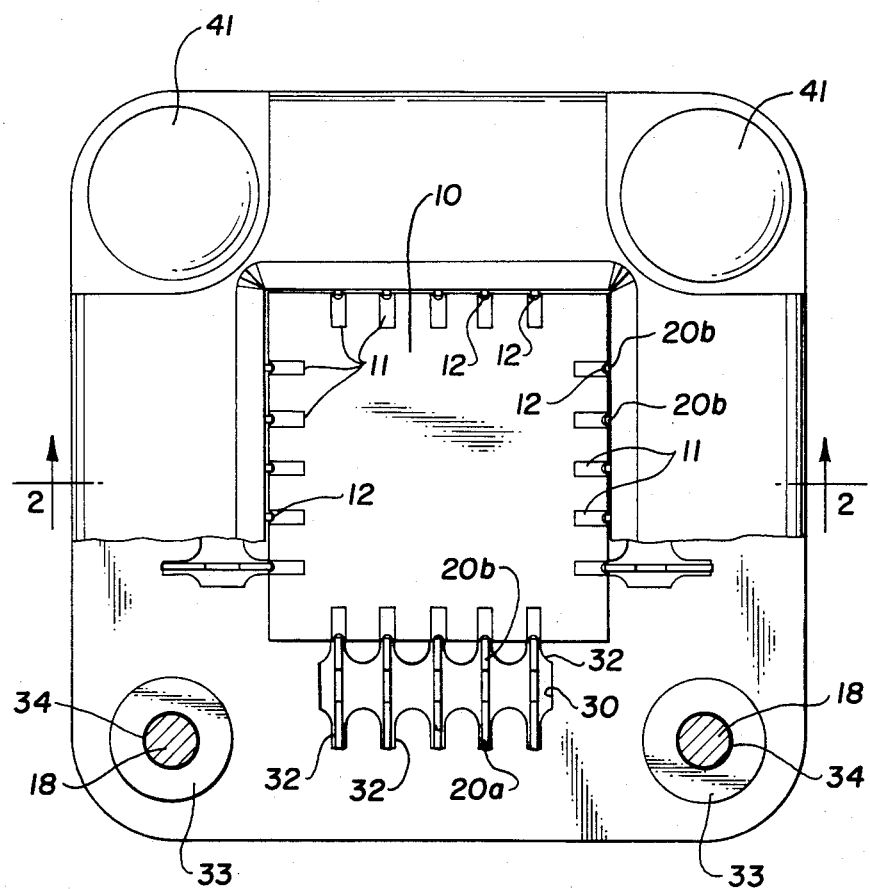
FIG. 1 is a top plan view of a twenty pin version of the preferred embodiment of the invention.

In FIG. 1, a typical twenty pin leadless chip carrier 10 is shown having five terminal lands 11 on the top surface of each edge thereof. Since the arrangement of the semiconductor chip within the cavity of the carrier and the interconnection of the chip with the lands 11 form no part of the invention, these details of the leadless chip carrier are not illustrated. However, the base portion of the leadless chip carrier in the embodiment shown is characteristic of ceramic base pieces formed by breaking the ceramic along a line of small holes. Therefore, the edge of the base piece has semicylindrical depressions 12 vertically traversing each lateral edge thereof. The lands 11 positioned on one or both faces of the leadless chip carrier 10 are indexed to the depressions 12 and usually extend into the depressions 12.

Figure 2:
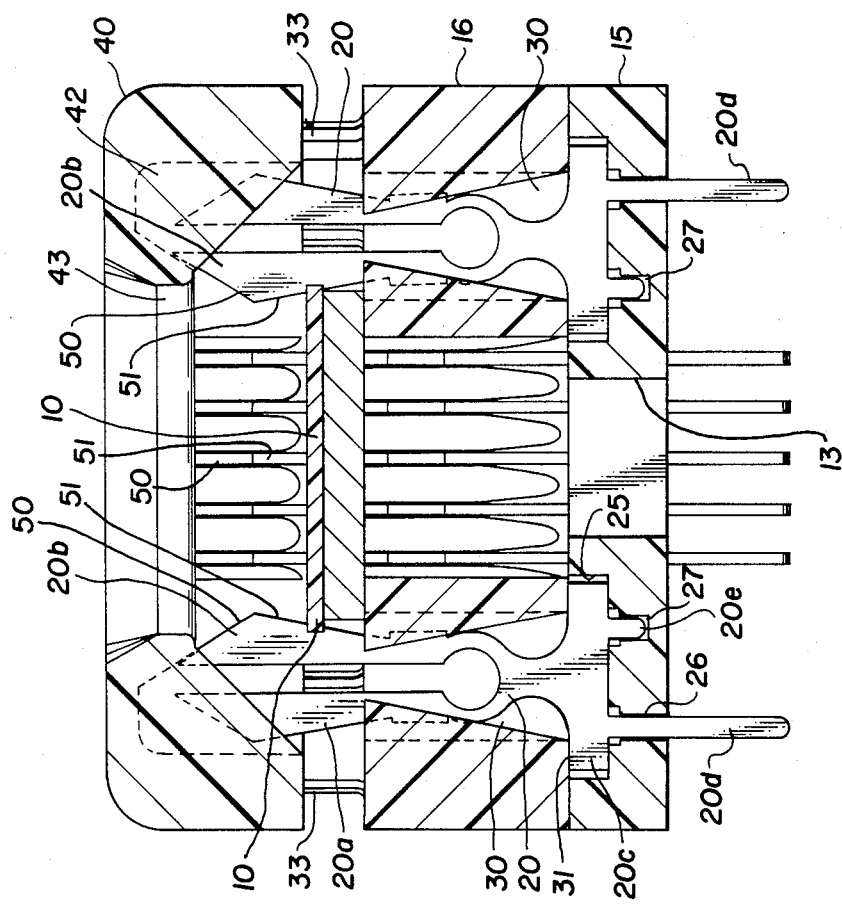
FIG. 2 is a sectional view of the apparatus of FIG. 1 taken through section lines 2—2.

The structure of the mounting housing is most clearly illustrated in FIG. 2. In the preferred embodiment, the housing comprises a base support 15; an intermediate support housing 16 which cooperates with the base support 15 to hold and position contact pins 20; and a spreader 40. The assembly is secured together by a plurality of studs 18 (shown in FIG. 1). The studs 18 secure the base support 15 and intermediate support housing 16 rigidly together and extend through spreader 40 permitting spreader 40 to move with respect to the remainder of the assembly as explained hereinafter.

In the preferred embodiment, the contact pins 20 are substantially flat axially elongated resilient electrically conductive bodies such as stainless steel coated with a suitable electrically conductive coating or beryllium copper alloys or the like formed with a pair of parallel arms or blades 20a and 20b extending from a common base 20c. Each pin 20 has one pin shank 20d and one index stud 20e extending from the base 20c in the direction opposite the blades 20a and 20b. The contact pin 20 is symmetrical about its longitudinal (vertical as shown in the drawings) axis except that the shank 20d is substantially longer than the index stud 20e.

The base 20c fits within a recess 25 in base support 15 with shank 20d extending through aperture 26 and index stud 20e fitted within indexing recess 27. Thus shank 20d extends vertically through the base support 15 to provide electrical connection with a substrate such as a circuit board or burn-in board or other socket or support means. It will be observed that aperture 26 and indexing recess 27 may be arranged in alternately reversed positions so that a plurality of shanks 20d project from the bottom surface of the base support 15 in parallel rows with the positions of the shanks 20d in each row staggered with respect to the shanks in the other row. Alternatively, aperture 26 and recess 27 may be identical apertures. Thus shanks 20d may be alternately reversed or all arranged in the same row.

The depth of recess 25 in the base support 15 is substantially equal to the vertical height of the base 20c of the pin member 20 so that the intermediate support housing 16, when mated with base support housing 15, locks the base 20c within the recess 25. The intermediate support housing 16 has outer lateral dimensions substantially conforming to the outer lateral dimensions of the base support 15 and has vertical channels 30 extending therethrough which align with the recesses 25. However, channels 30 are not as wide as the recesses 25, thus the shoulders 31 of the intermediate support 16 extend over the base 20c and secure the contact pin body within the housing. The internal surfaces of the channels 30 are provided with parallel slots 32 (most clearly shown in FIG. 1) aligned with the recesses 25 and apertures 26 to receive the blades 20a and 20b of the pin, thus supporting the pins 20 vertically and parallel with each other. It will thus be observed that with intermediate support housing 16 mated with base support 15, the pins 20 are secured vertically and parallel to each other in groups aligned in four rows defining a central rectangular area on the top surface of the intermediate support member 16.

In the preferred embodiment, the base support 15 and the intermediate housing support 16 have aligned apertures 34 extendeding vertically therethrough at each corner. The intermediate support 16 also has a post 33 on the top surface thereof surrounding each aperture 34. The base support 15 and intermediate support housing 16 are held firmly together by studs 18 passing through the apertures 34.

A spreader cap 40 having outer lateral dimensions substantially conforming to the outer lateral dimensions of the base support 15 and intermediate support housing 16 is mounted for vertical reciprocal movement on the posts 33. Preferably, the spreader cap 40 has apertures in the corners thereof in registry with the posts 33 and thus rides on the posts. The studs 18 have enlarged ends 41 for retaining the spreader cap on the assembly. The spreader cap 40 has a central rectangular cavity 42 which is larger than the rectangular area defined by the top ends of the pins 20. However, the top surface of the spreader cap 40 has an inwardly and downwardly projecting lip 43.

Figure 3:
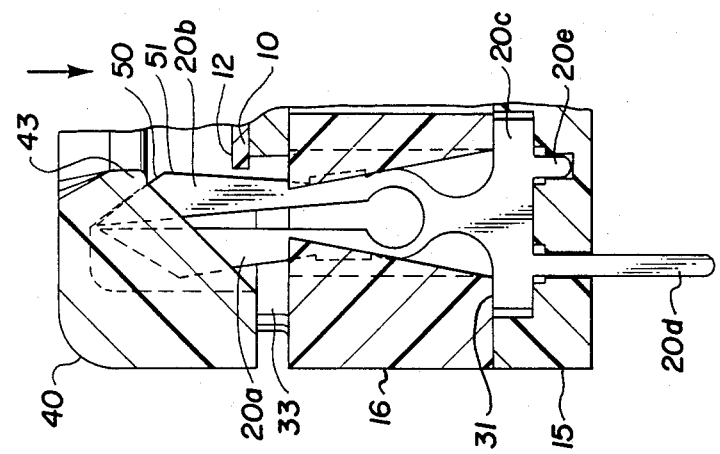
FIG. 3 is a sectional view of a portion of the apparatus of FIG. 1 taken through section lines 2—2 illustrating the action of the spreader to open the contact means.

As most clearly illustrated in FIGS. 2 and 3, the pin 20 is forked at about its mid-section to form blades 20a and 20b which project above the surface of the intermediate support housing 16. The outer edge of each blade 20a and 20b also diverges outwardly from the vertical axis of the pin 20 to a point near the top free end thereof and then diverges inwardly. The inwardly and downwardly projecting lip 43 is adapted to mate with and rest on the inwardly diverging edge 50 of each pin 20. It will thus be observed that as the spreader cap 40 is moved downwardly (as illustrated by the arrow in FIG. 3) the lip 43 acts as a camming surface against the edges 50 of the pins, thus bending the blades 20b toward the central axes of the pins 20 and outwardly with respect to the central cavity defined by the blades 20b. As the spreader cap 40 is uniformly pressed toward the support 16, all the inner blades 20b of the pins 20 are urged outwardly from the central cavity, thus aligning the otherwise inwardly inclined edges 51 substantially vertically. Since the central opening in the spreader cap 40 is slightly larger than the leadless chip carrier 10, and since the pins 20 are spread outwardly by the spreader cap 40, a leadless chip carrier may be inserted through the spreader cap 40 into the central cavity to rest on the top surface of the intermediate support 16. When downward pressure on the spreader cap 40 is released, the inner blades 20b return to their relaxed position (see FIG. 2) and engage the edges of the leadless chip carrier.

Where the terminal lands 11 are aligned with and extend into the semicylindrical depressions 12 on the edges of the leadless chip carrier base piece (as illustrated in FIG. 1), and where the pins 20 are spaced to likewise mate with the depressions 12, the inclined edges 51 of the blades 20b are urged into the depressions 12 to form physical and electrical contact with the lands 12. Furthermore, since the edges 51 are inclined inwardly from the vertical, the blades 20b securely lock the leadless chip carrier within the mounting housing.

The above described embodiment is particularly suitable for use in connection with leadless chip carriers wherein the ceramic base piece is formed by drilling holes therein and breaking the ceramic wafer along the line of holes. In such cases, the lands 11 are usually formed in registry with the semicylindrical depressions 12 formed by the breaking hole and thus the blades 20b are automatically aligned with the lands 11 and engage the lands within the semicylindrical depressions 12. Note that in this arrangement the contact means (the blades 20b) are indexed with the lands by reference to the semicylindrical depressions 12 which are the only precision-located points on the ceramic base piece. Since the electrical contact means 20b are not indexed with reference to any other portion of the ceramic base piece, precision and accurate indexing is always achieved.

Some leadless chip carriers are not formed by drilling holes in the ceramic base piece. Therefore, semicylindrical depressions 12 are not present and can not be used to index the lands 12. In such cases, the lands 12 may be formed only on one surface, on both surfaces, or actually wrapped around the lateral edges of the base piece. However, if the lands are wrapped around the edges, the above embodiment performs equally well since electrical contact is made between the portion of the land wrapped around the edge of the ceramic base and blade 20b. If, however, the ceramic base piece of the leadless chip carrier has no semicylindrical depression 12 to act as an indexing means and the land 11 does not extend around the edge of the ceramic base piece, the blades 20b may be modified as illustrated in FIGS. 4 and 5.

Figure 4:
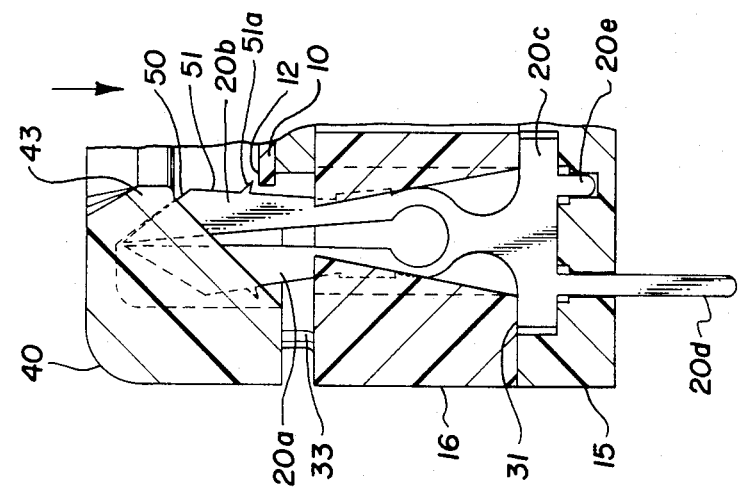
FIGS. 4 and 5 are sectional views of the same portion of the apparatus as shown in FIG. 3 illustrating an alternative embodiment of the contact means.
Figure 5:
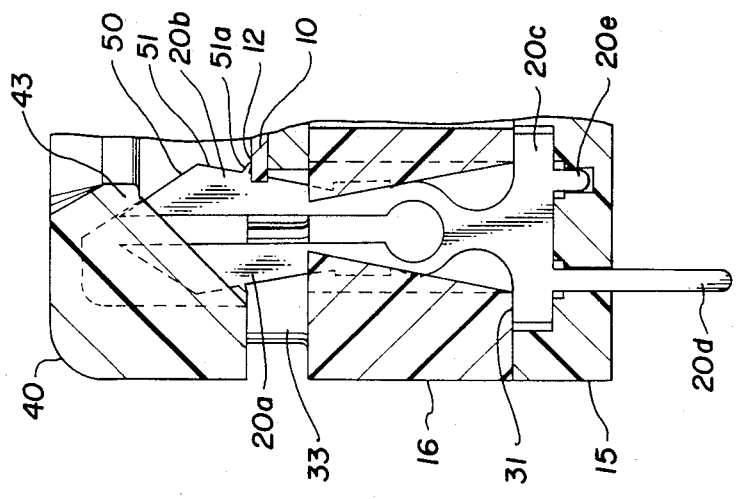

In the embodiment of FIGS. 4 and 5 the outwardly divergent edge 51 of blade 20b is modified to include an outwardly and downwardly extending barb 51a. Thus, when the spreader cap 40 is depressed, the blades 20b are withdrawn laterally to permit the leadless chip carrier to be positioned within the cavity. However, when the spreader cap 40 is released, the blades 20b move inwardly urging barbs 51a inwardly and downwardly into contact with the top surface of the lands 11. Since the barbs 51a move both laterally and downwardly when the blades 20b are released, the barbs 51a scrape the surface of the lands 11 to remove any oxidation therefrom and thus form good electrical contact with the lands 11 while also acting to retain the leadless chip carrier within the cavity.

It should be noted that the structure of the embodiment described is extremely simple and may be readily fabricated from available materials. For example, the housing may be made from three pieces of insulating material such as molded or machined plastic or the like. The pins 20 are symmetrical about their longitudinal axes (except for the lengths of shanks 20d and studs 20e), thus may be all identical and simply alternately reversed during assembly to provide parallel rows of pins. Furthermore, a centrally located aperture 13 may be provided in the base support 15 to permit cooling of the leadless chip carrier by convection or by a heat sink attached to the leadless chip carrier and projecting into the cavity. Likewise, since the top of the housing is open, a heat sink may be attached to the top side of the leadless chip carrier 10 and project through the central opening in the spreader cap 40.

It will be noted that no special tools are required to insert the leadless chip carrier into the housing of the invention. The leadless chip carrier is simply inserted within the opening in the central portion of the spreader cap 40 and the spreader 40 pressed toward the intermediate support 16. As the blades 20b retract laterally, the leadless chip carrier 10 simply drops into position on the top surface of the intermediate support housing. When the spreader cap 40 is released, the blades 20b automatically align with and form electrical contact with the lands 11.

Removal of the leadless chip carrier 10 from the housing is accomplished with similar ease. By pressing the spreader cap 40 toward the intermediate support housing 16, the blades 20b are retracted and the leadless chip carrier may be withdrawn from the housing by simply inverting the structure; by inserting a plunger or other suitable instrument through the aperture 13; or by other suitable simple and convenient means.

It should be noted that the housing of the invention is extremely compact and has no moving closure lid or the like. Thus the housing may be inexpensively manufactured and occupies minimum space on a mounting substrate. Furthermore, the housing can be designed to accommodate leadless chip carriers of various configurations without modification of the basic design of the housing.

Because of the simplicity of design and the ease with which leadless chip carriers may be inserted into and withdrawn from the housing of the invention, the housing has particular applicability and suitability for use in connection with burn-in boards wherein large numbers of leadless chip carriers are mounted in housings on a burn-in board and tested and stressed under adverse conditions. The housing is likewise applicable for use as a housing or mounting socket for end use circuit applications. Accordingly, while the invention has been described with particular reference to specific embodiments thereof, it is to be understood that the forms of the invention shown and described in detail are to be taken as preferred embodiments of same, and that various changes and modifications may be resorted to without departing from the spirit and scope of the invention as defined by the appended claims.

What is claimed is:

1. Mounting means for a leadless chip carrier comprising:

(a) base support means having first and second oppositely disposed major faces;

(b) a plurality of axially elongated conductive pins passing transversely through said base support means substantially perpendicular to said first and second major faces, the opposed inner edges of the ends of said pins extending from said first major face arranged to define a cavity substantially conforming to at least two oppositely disposed lateral peripheral dimensions of said leadless chip carrier in a plane parallel with said first major face and the inner edges of said pins converging slightly inwardly with distance from said first major face; and (c) unitary means operable independently of said leadless chip carrier reciprocally moveable axially with respect to said pins and coacting with said opposed inner edges of said pins for uniformly spreading the ends of said pins extending from said first major face to permit the insertion of a leadless chip carrier therebetween.

2. Mounting means as defined in claim 1 wherein each of said conductive pins comprises a substantially flat elongated conductive body with a centrally located base portion, a shank and an index stud extending parallel in a first direction from said base portion and a pair of blades extending parallel in the opposite direction from said base portion, said conductive pin body being substantially symmetrical about its central axis except for the relative lengths of said index stud and said shank.

3. Mounting means as defined in claim 2 wherein said base support means includes a plurality of recesses adapted to mate with and receive said base portions of said pins to support said pins with their axes parallel and normal to said first and second major faces.

4. Mounting means as defined in claim 2 wherein said base support means comprises a first base support means including recesses for receiving said base portions of said pins and an intermediate support housing mating with the first major face of said first base support means and having a plurality of channels passing therethrough, said channels each having slots in the walls thereof for receiving the outer edges of said blades.

5. Mounting means as defined in claim 4 including stud means passing through said first base portion, said intermediate support housing and said means for spreading the ends of said pins, said stud means rigidly securing said first base portion and said intermediate support housing together with said pins extending normal to said first and second major faces while permitting said means for spreading the ends of said pins to reciprocally move axially with respect to said stud means.

6. Mounting means as defined in claim 1 wherein said means for for spreading the ends of said pins comprises a rectangular body adapted for reciprocal movement parallel with the axes of said pins and having a central cavity therein greater in lateral dimensions than the lateral area defined by said pins and including camming means for mating with the ends of said pins to urge the free ends of said pins outwardly with respect to said cavity as the spreading means is moved axially with respect to said pins.

7. Mounting means for a leadless chip carrier comprising:

(a) a support housing having first and second oppositely disposed major faces;

(b) a plurality of axially elongated contact means mounted within said support housing and extending therethrough with their axes aligned parallel to each other and normal to said first and second major faces, the free ends of said contact means extending from said first major face arranged with their inner edges defining a cavity rectangular in dimensions in a plane substantially parallel with said first major face, the ends of said contact means defining said cavity having edges which incline inwardly toward said cavity in said plane substantially parallel with said first major face and outwardly from said cavity in a second plane substantially parallel with said first major face; and (c) unitary spreader means comprising a substantially rectangular body arranged substantially parallel with said first major face and reciprocally moveable axially with respect to said contact means, said spreader means having a surface inclined with respect to the axes of said contact means and mating with said inclined inner edges of said contact means whereby movement of said spreader means axially with respect to said contact means in a first direction urges said free ends of said contact means outwardly with respect to said cavity.

8. Mounting means as defined in claim 7 including a plurality of stud means extending from said first major face of said support housing parallel with said contact means.

9. Mounting means as defined in claim 8 wherein said spreader means is mounted for reciprocal movement on said stud means.

10. Mounting means as defined in claim 7 including a centrally located aperture in said support housing.

11. Mounting means as defined in claim 7 wherein the inwardly inclined edges of said contact means include an inwardly projecting barb.

12. Mounting means as defined in claim 7 wherein said axially elongated contact means comprises a plurality of substantially flat axially elongated electrically conductive bodies, each having a substantially centrally located base portion confined within said support housing and having a shank portion extending therefrom in a first direction through said second major face of said support housing and a pair of parallel blades extending in the opposite direction therefrom on opposite sides of the central axis of said contact means.

13. Mounting means as defined in claim 12 wherein said support housing includes a plurality of apertures in said second major face thereof arranged in parallel rows for receiving said shank portions.

14. Mounting means as defined in claim 13 wherein said contact means are arranged in said support housing in alternately reversed positions so that said shank portions project through said apertures in parallel rows with location of the shank portions alternately staggered in each row.

15. Mounting means for a leadless chip carrier comprising:

(a) base support means having first and second oppositely disposed major faces;

(b) a plurality of conductive pins passing transversely through said base support means substantially perpendicular to said first and second major faces, the ends of said pins extending from said first major face arranged to define a cavity substantially conforming to at least two oppositely disposed lateral peripheral dimensions of said leadless chip carrier in a plane parallel with said first major face and the inner edges of said pins converging slightly inwardly with distance from said first major face, each of said conductive pins comprising a substantially flat elongated conductive body with a centrally located base portion, a shank and an index stud extending parallel in a first direction from said base portion and a pair of blades extending parallel in the opposite direction from said base portion, said conductive pin body being substantially symmetrical about its central axis except for the relative lengths of said index stud and said shank; and (c) means operable independently of said leadless chip carrier and coacting with said inner edges of said pins for uniformly spreading the ends of said pins extending from said first major face to permit the insertion of a leadless chip carrier therebetween.

16. Mounting means as defined in claim 15 wherein said base support means includes a plurality of recesses adapted to mate with and receive said base portions of said pins to support said pins with their axes parallel and normal to said first and second major faces.

17. Mounting means as defined in claim 15 wherein said base support means comprises a first base support means including recesses for receiving said base portions of said pins and an intermediate support housing mating with the first major face of said first base support means and having a plurality of channels passing therethrough, said channels each having slots in the walls thereof for receiving the outer edges of said blades.

18. Mounting means as defined in claim 17 including stud means passing through said first base portion, said intermediate support housing and said means for spreading the ends of said pins, said stud means rigidly securing said first base portion and said intermediate support housing together with said pins extending normal to said first and second major faces while permitting said means for spreading the ends of said pins to reciprocally move axially with respect to said stud means.

19. Mounting means for a leadless chip carrier comprising:

(a) a support housing having first and second oppositely disposed major faces;

(b) a plurality of axially elongated contact means mounted within said support housing and extending therethrough with their axes aligned parallel to each other and normal to said first and second major faces, the free ends of said contact means extending from said first major face arranged to define a cavity rectangular in dimensions in a plane substantially parallel with said first major face, the ends of said contact means defining said cavity having edges which incline inwardly toward said cavity in said plane substantially parallel with said first major face and outwardly from said cavity in a second plane substantially parallel with said first major face;

(c) spreader means comprising a substantially rectangular body arranged substantially parallel with said first major face and reciprocally moveable axially with respect to said contact means, said spreader means having a surface inclined with respect to the axes of said contact means and mating with the inclined inner edges of said contact means whereby movement of said spreader means axially with respect to said contact means in a first direction urges said free ends of said contact means outwardly with respect to said cavity; and (d) barb means projecting inwardly from the inwardly inclined edges of said contact means.

20. Mounting means for a leadless chip carrier comprising:

(a) a support housing having first and second oppositely disposed major faces;

(b) a plurality of axially elongated contact means mounted within said support housing and extending therethrough with their axes aligned parallel to each other and normal to said first and second major faces, the free ends of said contact means extending from said first major face arranged to define a cavity rectangular in dimensions in a plane substantially parallel with said first major face, the ends of said contact means defining said cavity having edges which incline inwardly toward said cavity in said plane substantially parallel with said first major face and outwardly from said cavity in a second plane substantially parallel with said first major face, said axially elongated contact means comprising substantially flat axially elongated electrically conductive bodies, each having a substantially centrally located base portion confined within said support housing and having a shank portion extending therefrom in a first direction through said second major face of said support housing and a pair of parallel blades extending in the opposite direction therefrom on opposite sides of the central axis of said contact means; and (c) spreader means comprising a substantially rectangular body arranged substantially parallel with said first major face and reciprocally moveable axially with respect to said contact means, said spreader means having a surface inclined with respect to the axes of said contact means and mating with the inclined inner edges of said contact means whereby movement of said spreader means axially with respect to said contact means in a first direction urges said free ends of said contact means outwardly with respect to said cavity.

21. Mounting means as defined in claim 20 wherein said support housing includes a plurality of apertures in said second major face thereof arranged in parallel rows for receiving said shank portions.

22. Mounting means as defined in claim 21 wherein said contact means are arranged in said support housing in alternately reversed portions so that said shank portions project through said apertures in parallel rows with location of the shank portions alternately staggered in each row.

* * * * *

UNITED STATES PATENT AND TRADEMARK OFFICE
CERTIFICATE OF CORRECTION

PATENT NO. : 4,491,377
DATED : January 1, 1985
INVENTOR(S) : Wayne K. Pfaff

It is certified that error appears in the above-identified patent and that said Letters Patent is hereby corrected as shown below:

In Column 1, immediately following the title, insert as a new paragraph:

---This invention relates to mountings for electronic device packages. More particularly, it relates to mounting housings for use in connection with leadless chip carriers during testing and burn-in as well as for mounting leadless chip carriers on circuit boards or other substrates for use in circuit applications.---

Signed and Sealed this

Thirtieth Day of April 1985

[SEAL]

Attest:

DONALD J. QUIGG

*Attesting Officer*     *Acting Commissioner of Patents and Trademarks*